United States Patent
Treichler et al.

(10) Patent No.: US 9,513,324 B1
(45) Date of Patent: Dec. 6, 2016

(54) SYSTEM AND METHOD OF LOAD TESTING MULTIPLE POWER CONVERTERS WITHOUT DEDICATED TEST EQUIPMENT

(71) Applicant: Motiv Power Systems, Inc., Foster City, CA (US)

(72) Inventors: William Treichler, Belmont, CA (US); Cullen Teague McMahon, San Francisco, CA (US); Justin Anthony Tomlin, San Francisco, CA (US); James Michael Castelaz, Alameda, CA (US)

(73) Assignee: Motiv Power Systems, Inc., Foster City, CA (US)

( * ) Notice: Subject to any disclaimer, the term of this patent is extended or adjusted under 35 U.S.C. 154(b) by 323 days.

(21) Appl. No.: 14/214,380

(22) Filed: Mar. 14, 2014

Related U.S. Application Data

(60) Provisional application No. 61/784,732, filed on Mar. 14, 2013.

(51) Int. Cl.
   *G01R 31/02* (2006.01)

(52) U.S. Cl.
   CPC ................................ *G01R 31/02* (2013.01)

(58) Field of Classification Search
   CPC .... G01R 31/02; G01R 31/10; G01R 31/024; G01R 31/025; G01R 31/026; H02M 7/00; H02M 2001/0009; H02M 2001/0012; H02H 7/10
   USPC .......... 324/537, 750.05, 509, 522, 523, 527, 324/750.01, 750.02, 750.3, 764.01, 765.01; 363/13, 50
   See application file for complete search history.

(56) References Cited

U.S. PATENT DOCUMENTS

| | | | | |
|---|---|---|---|---|
| 5,659,208 A * | 8/1997 | Kimble | ................ | H02M 3/285 307/146 |
| 5,751,150 A * | 5/1998 | Rippel | ............... | G01R 31/2841 324/537 |
| 2006/0132106 A1 | 6/2006 | Lucas et al. | ................... | 323/267 |
| 2007/0091517 A1 | 4/2007 | Lucas et al. | .................... | 361/20 |
| 2008/0186741 A1* | 8/2008 | Rabo | ...................... | H02M 7/797 363/13 |
| 2008/0197825 A1* | 8/2008 | Siri | ......................... | H02J 1/102 323/272 |
| 2008/0247199 A1* | 10/2008 | Djenguerian | ..... | H02M 3/33523 363/50 |
| 2009/0296432 A1* | 12/2009 | Chapuis | .................... | H02J 1/08 363/65 |
| 2010/0109622 A1* | 5/2010 | Miki | .................. | H02M 3/1584 323/272 |
| 2013/0127482 A1* | 5/2013 | Chang | .................... | G01R 31/40 324/750.05 |
| 2013/0241466 A1* | 9/2013 | Mitsuda | .............. | H01M 10/441 320/103 |

* cited by examiner

*Primary Examiner* — Arleen M Vazquez
*Assistant Examiner* — Steven Yeninas
(74) *Attorney, Agent, or Firm* — Imperium Patent Works; Amir V. Adibi

(57) ABSTRACT

A test system includes a first, second, and third power converter and a data collection system. The test system performs load testing on the second and third power converters without requiring any external load. The first power converter is supplied by an Alternating Current (AC) source. During a test cycle, the first, second, and third power converters are controlled such that the second power converter is supplied by an output current of the first power converter and a feedback current output by the third power converter. The third power converter receives current output by the second power converter and outputs the feedback current onto the second power converter. The data collection system receives power converter test characteristics (voltage, current, and temperature information) during the test cycle without any power being dissipated by an external load. Test information is used to determine whether the second and third power converters are defective.

20 Claims, 13 Drawing Sheets

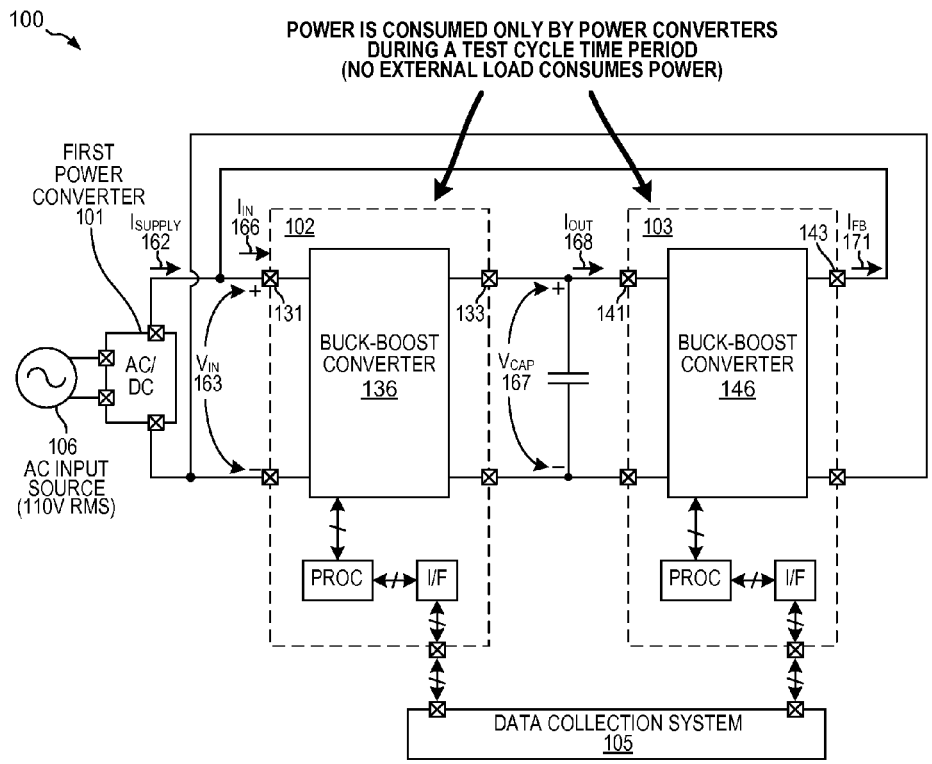

FIG. 12

| | SPACE REDUCTION | COST REDUCTION | POWER CONSUMPTION (%EFFICIENCY) | TESTING THROUGHPUT |
|---|---|---|---|---|
| CONVENTIONAL TESTING OF POWER CONVERTER WITH EXTERNAL LOAD AS IN FIG. 1 (PRIOR ART) | EXTERNAL LOAD IS LARGE CONSUMING TESTING SPACE. | REQUIRES EXTERNAL LOAD. | ALL ENERGY IS DISSIPATED THROUGH THE EXTERNAL LOAD AS HEAT. | ONLY A SINGLE POWER CONVERTER IS TESTED IN A TEST CYCLE AND REQUIRES RECONFIGURATION FOR EACH CONVERTER. |
| CONVENTIONAL TESTING OF POWER CONVERTER WITH REGENERATIVE SYSTEM AS IN FIG. 2 (PRIOR ART) | TEST EQUIPMENT IS LARGE AND CONSUMES TESTING SPACE. | REQUIRES EXPENSIVE TEST EQUIPMENT. | | ONLY A SINGLE POWER CONVERTER IS TESTED IN A TEST CYCLE AND REQUIRES RECONFIGURATION FOR EACH CONVERTER. |
| TESTING SECOND POWER CONVERTER AND THIRD POWER CONVERTER AS IN FIG. 5 | NO DEDICATED TEST EQUIPMENT REQUIRED. | NO DEDICATED TEST EQUIPMENT REQUIRED. | ~90% IMPROVEMENT OVER CONVENTIONAL TESTING OF FIG. 1 (ASSUMING CONVERTERS ARE 95% EFFICIENT). | MULTIPLE POWER CONVERTERS TESTED SIMULTANEOUSLY. |

FIG. 13

(ANOTHER EMBODIMENT)

(ANOTHER EMBODIMENT)

SYSTEM AND METHOD OF LOAD TESTING MULTIPLE POWER CONVERTERS WITHOUT DEDICATED TEST EQUIPMENT

CROSS REFERENCE TO RELATED APPLICATION

This application claims the benefit under 35 U.S.C. §119 of U.S. provisional patent application Ser. No. 61/784,732, entitled "System And Method Of Load Testing Power Converters", filed Mar. 14, 2013. The subject matter of U.S. provisional patent application Ser. No. 61/784,732 is incorporated herein by reference.

TECHNICAL FIELD

The present disclosure relates generally to methods for testing devices, and more particularly, to load testing power converters.

BACKGROUND INFORMATION

FIG. 1 (Prior Art) is a diagram of a conventional test system 10 for testing a power converter for defects. Test system 10 includes a first power converter 11, a second power converter 12, a voltage stabilization capacitor 13, an external load 14, and a data collection system 15. An Alternating Current (AC) source 16 supplies the first power converter 11. The data collection system 15 performs and configures a test cycle by communicating with the second power converter 12 via link 17. During a test cycle, the second power converter 12 is controlled to output a voltage and a current. Test cycles are performed by varying the output voltages and currents of the power converters. The test data is collected by the data collection system 15 and is used to determine whether the second power converter 12 operates as expected and is ready for field applications.

The current output by the second power converter 12 during the test cycle is supplied to an external load 14. In one example, the external load 14 is a resistive water heater element. In another example, the external load 14 is an air-cooled resistive load. The energy involved in load testing the second power converter 12 is primarily dissipated by the resistive load 14. As a result, load testing in the test system 10 results in significant power consumption. In addition, external load 14 is costly and consumes physical space in a lab facility. Moreover, each power converter to be tested requires a separate external load 14.

FIG. 2 (Prior Art) is a diagram of a conventional test system 20 that has improved power consumption over system 10. System 20 includes a power converter 21, a regenerative load 22, and a controller 23. During a test cycle, the power converter 21 supplies power to the regenerative load 22, and the regenerative load 22 provides power back to the converter 21. Although the test system 20 consumes less power during a test cycle than test system 10, test system 20 is expensive. Moreover, regenerative load 22 only affords use for testing power converters and consumes lab facility space. In addition, test system 20 provides for testing only a single power converter at a time resulting in testing throughput shortcomings. An improved solution is desired.

SUMMARY

A test system includes a first power converter, a second power converter, a third power converter, and a data collection system. The test system performs load testing on the second and third power converters without requiring any external load. Load testing involves performing test cycles on a power converter where the power converter is operated in conditions that the power converter is expected to undergo in field use. If test data collected from the load testing is outside of acceptable ranges, then the power converter is considered to have failed the load test. A failed load test tends to indicate a manufacturing defect. As such, manufacturers of power converters typically conduct load testing on their power converters prior to distribution to ensure that their power converters will operate as expected. In addition, entities that develop systems having power converters, such as electric vehicle manufacturers, typically conduct load testing of the power converters installed in their systems prior to distribution.

During the load testing, energy that is transferred from the second power converter to the third power converter is fed back to the second power converter. Similarly, energy that is transferred from the third power converter to the second power converter during the load testing is fed back to the third power converter. The only significant power loss that occurs during the load testing in the novel test system is due to energy that is dissipated by the power converters because of inefficiencies inherent in the converters. The feedback of energy between the second and third power converters during the load testing results in a significant reduction in power loss. In addition, because the second and third power converters are identical, and usually bidirectional devices, they can be tested in the same test setup without any re-configuration resulting in greater testing throughput. Moreover, cost and space requirements are minimized because no dedicated test equipment is required to perform the load testing.

A data collection system is coupled to receive test data obtained during the load testing of the second and third power converters. In one example, the data collection system is a laptop computer that communicates with the second and third power converters via a Universal Serial Bus (USB) link. The laptop computer stores a set of instructions, for example a set of instructions realized in python source code that stores the load testing configuration. In another example, the set of instructions is a set of C instructions that is compiled and executed by the processor. A python interpreter interprets the set of instructions and causes digital control signals to be communicated to the second and third power converters thereby controlling the second and third power converters to undergo the load testing. The second and third power converters include sensing circuitry that sense power converter test characteristics during the test cycles. Each of the power converters communicates digital signals indicative of the sensed power converter test characteristics to the laptop computer. The laptop computer processes the received power converter test characteristic information to determine whether the power converters have passed the test cycle. In another example, the laptop computer communicates the received test data to a test server via a network, and the test server stores the test data in a database.

In one embodiment, the first power converter is an Alternating Current-to-Direct Current (AC-to-DC) power converter of between 2 kW and 8 kW, and each of the second and third power converters is a bi-directional Direct Current-to-Direct Current (DC-to-DC) power converter of approximately 30 kW. The second and third power converters are substantially identical and have equivalent circuit structures. The first power converter receives a 110V Root Mean Square (RMS) voltage from an Alternating Current (AC)

source, and the first power converter outputs a voltage and a current. The current output by the first power converter is supplied to a supply node. The supply node is coupled to terminals of both of the second and third power converters.

The data collection system is operable in a first test mode and in a second test mode. In the first test mode, the data collection system sets the output current and voltage of the second and third power converters for a test cycle time period such that the third power converter receives current flow from the second power converter, and the third power converter supplies a feedback current to the second power converter during the test cycle time period. A current path extends from a terminal of the second power converter, through the third power converter, through the supply node, and onto another terminal of the second power converter. The current path does not extend through any external load or regenerative load, as in conventional techniques. In addition, the current path does not extend through any device having a circuit structure different from the second power converter because the second and third power converters are equivalent circuit structures.

In the second test mode, the data collection system sets the output current and voltage of the second and third power converters for a test cycle time period such that the second power converter receives current flow from the third power converter, and the second power converter supplies a feedback current to the third power converter during the test cycle time period. A current path extends from a terminal of the third power converter, through the second power converter, through the supply node, and onto another terminal of the third power converter. The current path does not extend through any external load or regenerative load resulting in minimal power consumption. If each power converter is ninety-five percent efficient, then each test cycle results in approximately ten percent power loss of the total power that is processed. The first power converter compensates for the ten percent power loss by processing the 110V RMS supply and outputting the required current onto the supply node.

Sensing circuitry internal to the second and third power converter senses power converter test characteristics during the test cycle time period. The power converter test characteristic is information that tends to indicate whether a fault is present in a power converter causing the power converter to operate undesirably. Such faults are typically a result of manufacturing defects. Examples of power converter test characteristics include: a voltage present between two terminals of a power converter, a voltage internal to a power converter, a current flowing through a terminal of a power converter, a current internal to a power converter, a temperature at a surface of a power converter, and a temperature internal to a power converter. In another example, sensing circuitry is used that is external to the second and third power converters.

In another embodiment, a test system includes a multi-phase DC-to-DC power converter, a first power converter, and a data collection system. The multi-phase DC-to-DC power converter includes a second power converter, a third power converter, and a fourth power converter. The second, third, and fourth power converters are each referred to as sub-converters. Because the multi-phase converter includes at least two sub-converters, the novel testing technique can be used to perform load testing on each individual sub-converter such that energy is transferred between at least two sub-converters during the load testing.

In yet another embodiment, the test system comprises a first power converter, a second power converter, a third power converter, a first energy storage system, a second energy storage system, and a data collection system. The second power converter is coupled to a first energy storage system and the third power converter is coupled to a second energy storage system. In one example, each of the energy storage systems is a battery pack having a plurality of cells and a Battery Management System (BMS). In accordance with the novel testing technique, the energy transferred between the second and third power converters during test cycles can be stored in the battery packs. In addition, the second and third power converters can receive stored energy from their respective battery packs and supply a current onto the other power converter for load testing.

In yet another embodiment, a test system performs load testing on a first three-phase motor and a second three-phase motor by transferring mechanical energy between the first and second motors. The test system includes a first power converter, a second power converter, a third power converter, a motor controller, a data collection system, the first and second three-phase motors, a torque sensor, and a mechanical link. The mechanical link couples a motor output shaft of the first motor to a motor output shaft of the second motor. During load testing of the motors, the first motor drives the mechanical linkage that engages the second motor and thereby causes the third power converter to generate a feedback current. The feedback current is supplied from the third power converter to the second power converter and used, in part, by the second power converter to power the first motor during a test cycle time period. Similarly, during load testing of the second motor, the second motor drives the mechanical linkage that engages the first motor and thereby causes the second power converter to generate a feedback current. The feedback current is supplied from the second power converter to the third power converter and used, in part, by the third power converter to power the second motor during a test cycle time period. As such, power consumption is reduced because energy is transferred between both motors during load testing.

The data collection system obtains test data from the first and second motors through the motor controller via sensing circuitry internal to the first and second motors. In addition, the data collection system obtains test data from the external torque sensor. The data collection system analyzes the test data to determine operational characteristics of the motors. In addition, the data collection system is configured to detect an input current at each of the second and third power converters that drive the motors and use such data to generate a torque and angular velocity dependent efficiency map for each motor that is tested.

The foregoing is a summary and thus contains, by necessity, simplifications, generalizations and omissions of detail; consequently is it appreciated that the summary is illustrative only. Still other methods, and structures and details are set forth in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 12 is a diagram of the test system 100 showing how all power loss resulting from supplying current to the converters 102 and 103 is consumed entirely by the second power converter 102 and the third power converter 103.

FIG. 13 is a table 340 identifying several advantages between the novel test system 100 of FIG. 5 and the conventional test systems of FIGS. 1 and 2.

DETAILED DESCRIPTION

Reference will now be made in detail to some embodiments of the invention, examples of which are illustrated in the accompanying drawings.

Figure 3:
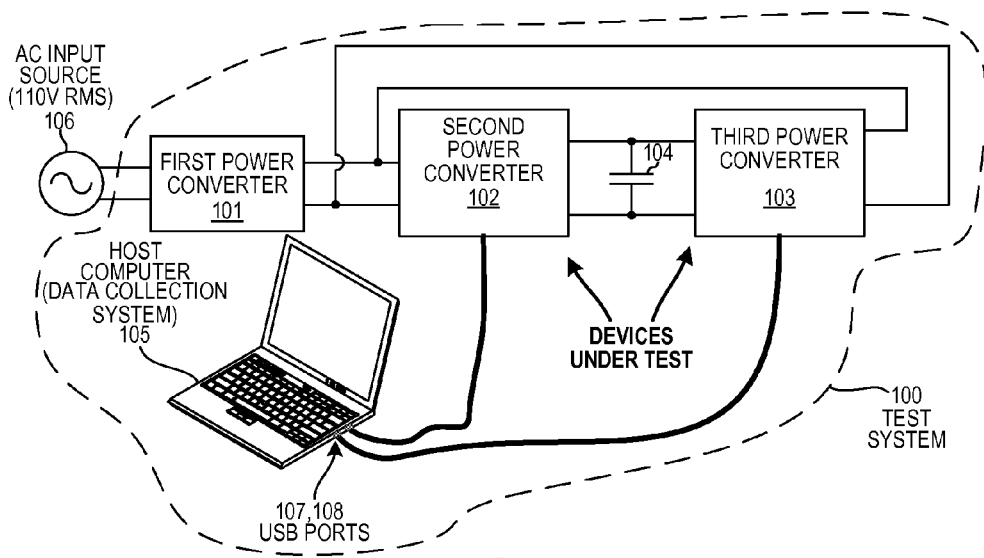
FIG. 3 is a diagram of a test system 100 for load testing two power converters without an external load.

FIG. 3 is a diagram of a test system 100 for load testing two power converters without an external load. Test system 100 comprises a first power converter 101, a second power converter 102, a third power converter 103, a capacitor 104, and a data collection system 105. An Alternating Current (AC) input source 106 outputs and supplies a 110V Root Mean Square (RMS) voltage onto two terminals of the first power converter 101. The capacitor 104 is coupled between two terminals of the second power converter 102 and the two terminals of third power converter 103. The capacitor 104 provides voltage stabilization between the second power converter 102 and the third power converter 103. In this example, the data collection system 105 is a portable laptop computer having Universal Serial Bus (USB) ports 107 and 108 for communicating with the power converters 102 and 103. The test system 100 is operable to perform load testing on the second power converter 102 and the third power converter 103 without an external load as explained in further detail below.

Figure 1:
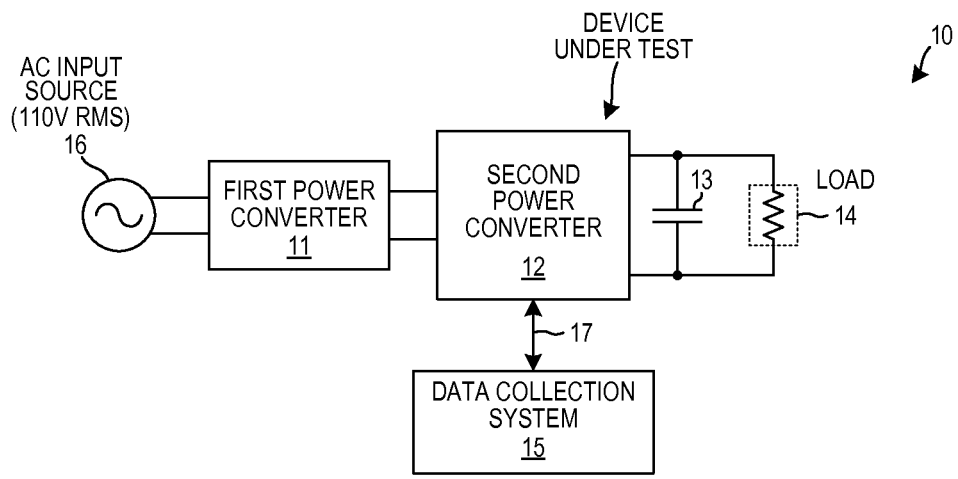
FIG. 1 (Prior Art) is a diagram of a conventional test system 10 for testing a power converter for defects.
Figure 4:
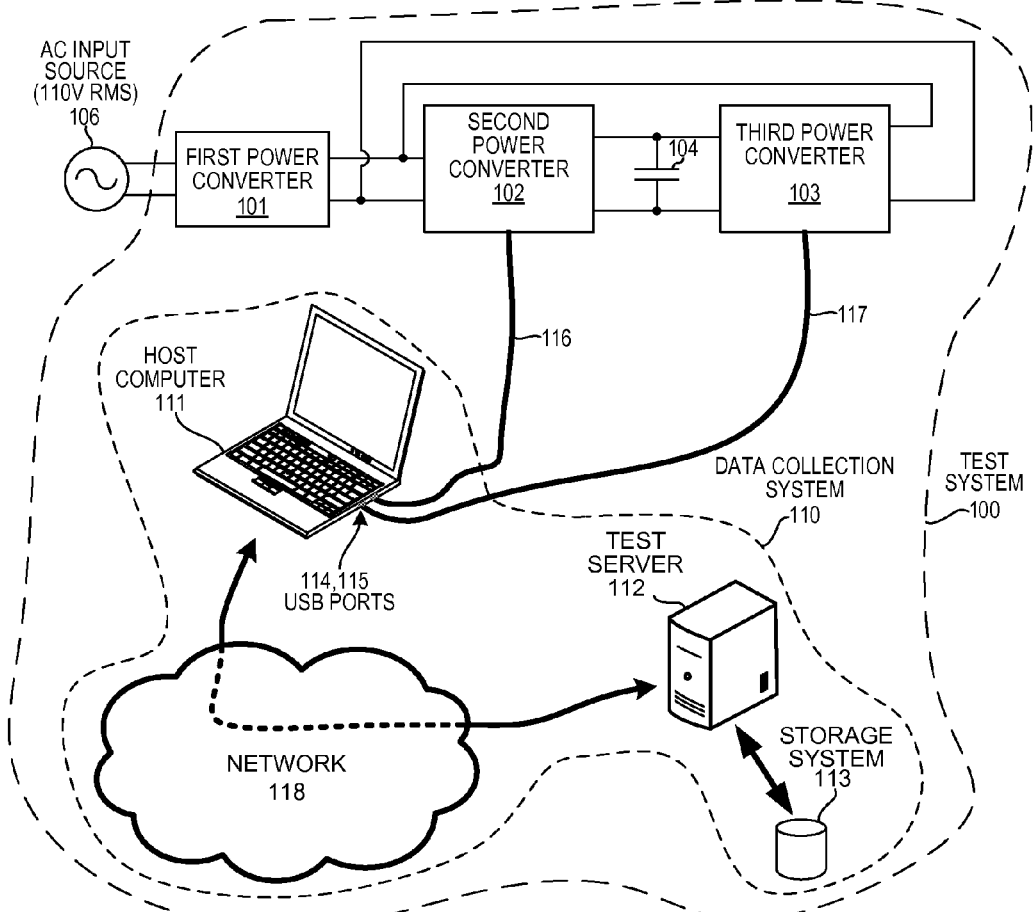
FIG. 4 is a diagram that shows another embodiment 110 of the data collection system 105 of FIG. 3.

FIG. 4 is a diagram that shows another embodiment 110 of the data collection system 105 of FIG. 1. Data collection system 110 comprises a host computer 111, a test server 112, and a storage system 113. Host computer 111 includes USB ports 114 and 115 for communicating with the power converters 102 and 103. Test data is received from the power converters 102 and 103 via USB cables 116 and 117, and the test data is communicated to the test server 112 via network 118. Test server 112 stores the test data into a storage system 113, for example a database. The test server 112 processes the test data to determine whether the second power converter 102 or the third power converter 103 is operating properly.

Figure 5:
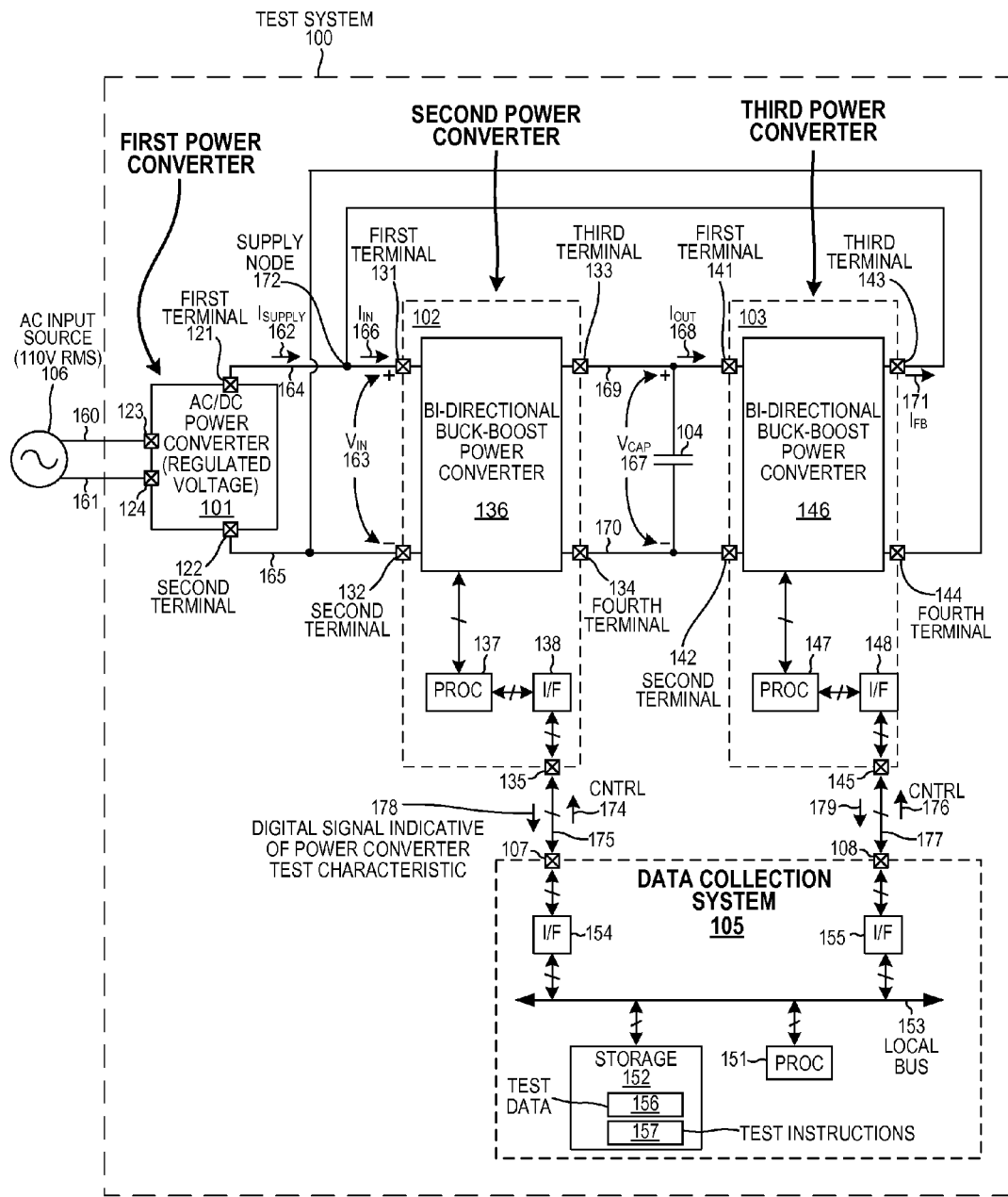
FIG. 5 is a detailed block diagram of the test system 100 of FIG. 3.

FIG. 5 is a detailed block diagram of the test system 100 of FIG. 3. In this example, the first power converter 101 is an Alternating Current-to-Direct Current (AC-to-DC) power converter having a first terminal 121, a second terminal 122, a third terminal 123, and a fourth terminal 124. The second power converter 102 comprises a first terminal 131, a second terminal 132, a third terminal 133, a fourth terminal 134, a fifth terminal 135, a bi-directional buck-boost Direct Current-to-Direct Current (DC-to-DC) converter 136, a processor 137, and interface circuitry 138. The third power converter 103 comprises a first terminal 141, a second terminal 142, a third terminal 143, a fourth terminal 144, a fifth terminal 145, a bi-directional buck-boost DC-to-DC converter 146, a processor 147, and interface circuitry 148. The fifth terminals 135 and 145 are communication terminals. The data collection system 105 comprises the first terminal 107, the second terminal 108, a processor 151, storage 152, a local bus 153, and interface circuitry 154 and 155. Test data 156 that is sensed during the load testing is stored in the storage 152 of the data collection system 105. Test instructions 157 are stored in the storage 152 that when interpreted (or executed) by processor 151, cause the load testing to be performed.

The AC-to-DC power converter 101 receives the 110V RMS voltage from the AC input source 106 onto terminals 123 and 124 via conductors 160 and 161. The AC-to-DC power converter 101 outputs a current $I_{SUPPLY}$ 162 and a regulated voltage $V_{IN}$ 163 onto conductors 164 and 165. The second power converter 102 receives an input current $I_{IN}$ 166 onto the first terminal 131, and the second power converter 102 outputs a voltage $V_{CAP}$ 167 and a current $I_{OUT}$ 168 onto conductors 169 and 170 via terminals 133 and 134. The third power converter 103 receives the current $I_{OUT}$ 168 from the second power converter 102 onto the first terminal 141 via conductor 169, and the third power converter 103 outputs a regulated current $I_{FB}$ 171 onto conductor 164 via the third terminal 143. The input current $I_{IN}$ 166 is formed by summing the regulated current $I_{FB}$ 171 output by the third power converter 103 and the current $I_{SUPPLY}$ 162 output by the first power converter 101 at a supply node 172. The supply node 172 is coupled to the first terminal 121 of the first power converter 101, to the first terminal 131 of the second power converter 102, and to the third terminal 143 of the third power converter 103. An upper plate of the capacitor 104 is coupled to the conductor 169 and a lower plate of capacitor 104 is coupled to the conductor 170.

The data collection system 105 controls the load testing of the second power converter 102 and the third power converter 103. To control the second power converter 102, the processor 151 causes a digital control signal 174 to be supplied to the second power converter 102 via local bus 153, through interface circuit 154, through terminal 107, through USB/CAN link 175, through the fifth terminal 135, and onto interface circuit 138. The processor 137 of the second power converter 102 receives and processes the control signal 174 thereby controlling the operation of the DC-to-DC converter 136. Similarly, to control the third power converter 103, the processor 151 causes a digital control signal 176 to be supplied to the third power converter 103 via local bus 153, through interface circuit 155, through terminal 108, through USB/CAN link 177, through the fifth terminal 145, and onto interface circuit 148. The processor 147 of the third power converter 103 receives and processes the control signal 176 thereby controlling the operation of the DC-to-DC converter 146.

The data collection system 105 receives test data, referred to as power converter test characteristics, from the second power converter 102 and the third power converter 103 via the USB/CAN links 175 and 176. To receive power converter test characteristics from the second power converter 102 during a test cycle time period, processor 137 obtains a power converter test characteristic that is sensed by sensing circuitry (see FIG. 6) within the DC-to-DC converter 136. The processor 137 causes a digital signal 178 indicative of the power converter test characteristic that is sensed by the sensing circuitry to be generated and supplied from the interface circuitry 138, through the fifth terminal 135, through USB/CAN link 175, through terminal 107, and onto interface circuitry 154. The processor 151 stores the power converter test characteristic obtained from the digital signal 178 into storage 152. Similarly, to receive power converter test characteristics from the third power converter 103 during a test cycle time period, processor 147 obtains a power converter test characteristic that is sensed by sensing circuitry (see FIG. 6) within the DC-to-DC converter 146. The processor 147 causes a digital signal 179 indicative of the power converter test characteristic that is sensed by the sensing circuitry to be generated and supplied from the interface circuitry 148, through the fifth terminal 145, through USB/CAN link 177, through terminal 108, and onto interface circuitry 155. The processor 151 stores the power converter test characteristic obtained from the digital signal 179 into storage 152.

The power converter test characteristic is a measurement taken during the operation of a power converter that is indicative of whether the power converter is operating as expected, is not damaged, and does not include manufacturing defects, or some other defect that would cause failure or unexpected results during operation. In one example, the power converter test characteristic is a voltage present between two terminals of a power converter, such as the voltage $V_{IN}$ 163 between the first terminal 131 and the second terminal 132 or the voltage $V_{CAP}$ 167 between third terminal 133 and fourth terminal 134. In another example, the power converter test characteristic is a current flowing through a terminal of a power converter, such as current $I_{IN}$ 166 flowing through the first terminal 131 or current $I_{OUT}$ 168 flowing through the third terminal 133. In yet another example, the power converter test characteristic is a temperature of a power converter, for example, a temperature sensor (not shown) disposed within the DC-to-DC converter 136 senses a temperature of the DC-to-DC converter 136. In this example, the processor 151 obtains and stores power converter test characteristics for each of the second and third power converters 102 and 103 during a test cycle time period. Reference numeral 156 identifies the stored power converter test characteristics. The processor 151 uses the obtained power converter test characteristics to determine whether the each of the power converters passes the load test.

Figure 6:
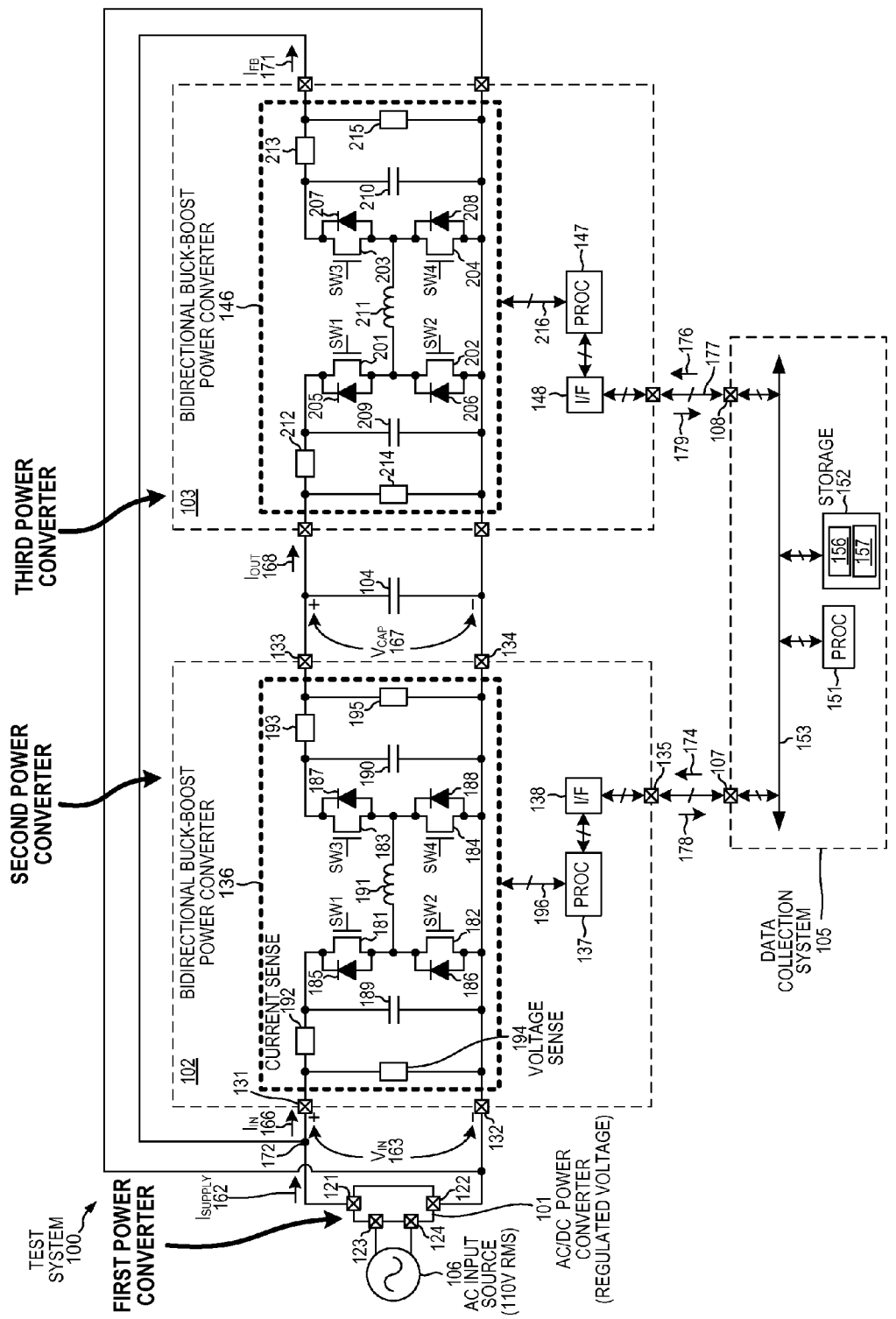
FIG. 6 is a circuit diagram of the test system 100 of FIG. 3.

FIG. 6 is a circuit diagram of the test system 100 of FIG. 3. The bi-directional buck-boost DC-to-DC converter 136 comprises N-channel Metal Oxide Semiconductor Field-Effect Transistors (MOSFETs) 181, 182, 183, and 184, diodes 185, 186, 187, and 188, capacitors 189 and 190, inductor 191, current sense circuitry 192 and 193, and voltage sense circuitry 194 and 195. The bi-directional buck-boost DC-to-DC converter 146 comprises N-channel Metal Oxide Semiconductor Field-Effect Transistors (MOSFETs) 201, 202, 203, and 204, diodes 205, 206, 207, and 208, capacitors 209 and 210, inductor 211, current sense circuitry 212 and 213, and voltage sense circuitry 214 and 215. The transistors 181-184 and 201-204 need not be MOSFET devices and may be realized as Insulated-Gate Bipolar Transistors (IGBTs).

The bi-directional buck-boost DC-to-DC converter 136 is a substantially identical structure as the bi-directional buck-boost DC-to-DC converter 146. As shown in FIG. 6, the circuitry of converter 136 is equivalent to the circuitry of converter 146, and the converter 136 operates in the same fashion as converter 146. In accordance with one novel aspect, the test system 100 allows two identical power converters to be tested in the same testing setup without having to modify a test script or re-wire each power converter prior to testing as in the prior art. Because the power converters 102 and 103 are bi-directional circuit structures, after one of the power converters 102 and 103 is tested, the other of the power converters 102 and 103 is tested without having to perform any re-wiring. In addition, another power converter that has the identical circuitry as power converter 102 or 103 may be tested by substituting out one of the power converters 102 or 103, inserting the new power converter to be tested, and executing the test script without having to modify the test script from a prior test cycle. The above features yield increased testing throughput, among other numerous advantages.

The processor 137 controls the bi-directional buck-boost DC-to-DC converter 136 by supplying digital logic control signals SW1, SW2, SW3, and SW4 to converter 136 via conductors 196. Digital logic control signal SW1 is supplied to a gate of transistor 181. Digital logic control signal SW2 is supplied to a gate of transistor 182. Digital logic control signal SW3 is supplied to a gate of transistor 183. Digital logic control signal SW4 is supplied to a gate of transistor 184. The digital logic levels and timing of the switching of the controls signals SW1, SW2, SW3, and SW4 depend upon whether current is flowing from a higher potential to a lower potential in which case the power converter 136 operates in a buck mode, or whether current is flowing from a lower potential to a higher potential in which case the power converter 136 operates in a boost mode. The processor 147 controls the bi-directional buck-boost DC-to-DC converter 146 in a similar fashion by supplying digital logic control signals SW1, SW2, SW3, and SW4 to converter 136 via conductors 216.

Figure 7:
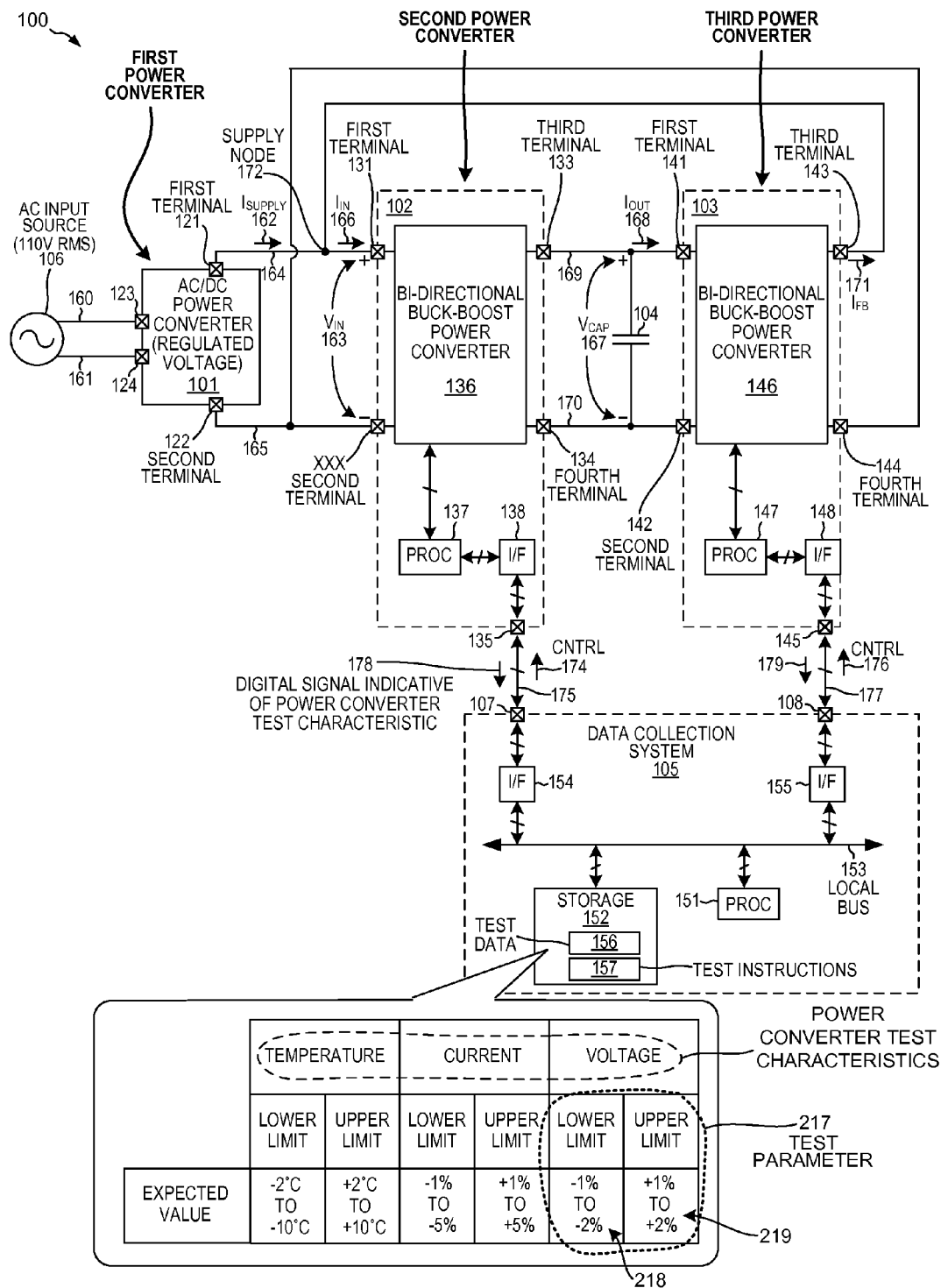
FIG. 7 is a diagram that shows how the data collection system 105 stores power converter test parameters for each of the power converter test characteristics that are sensed.

FIG. 7 is a diagram that shows how the data collection system 105 stores power converter test parameters for each of the power converter test characteristics that are sensed.

Figure 8:
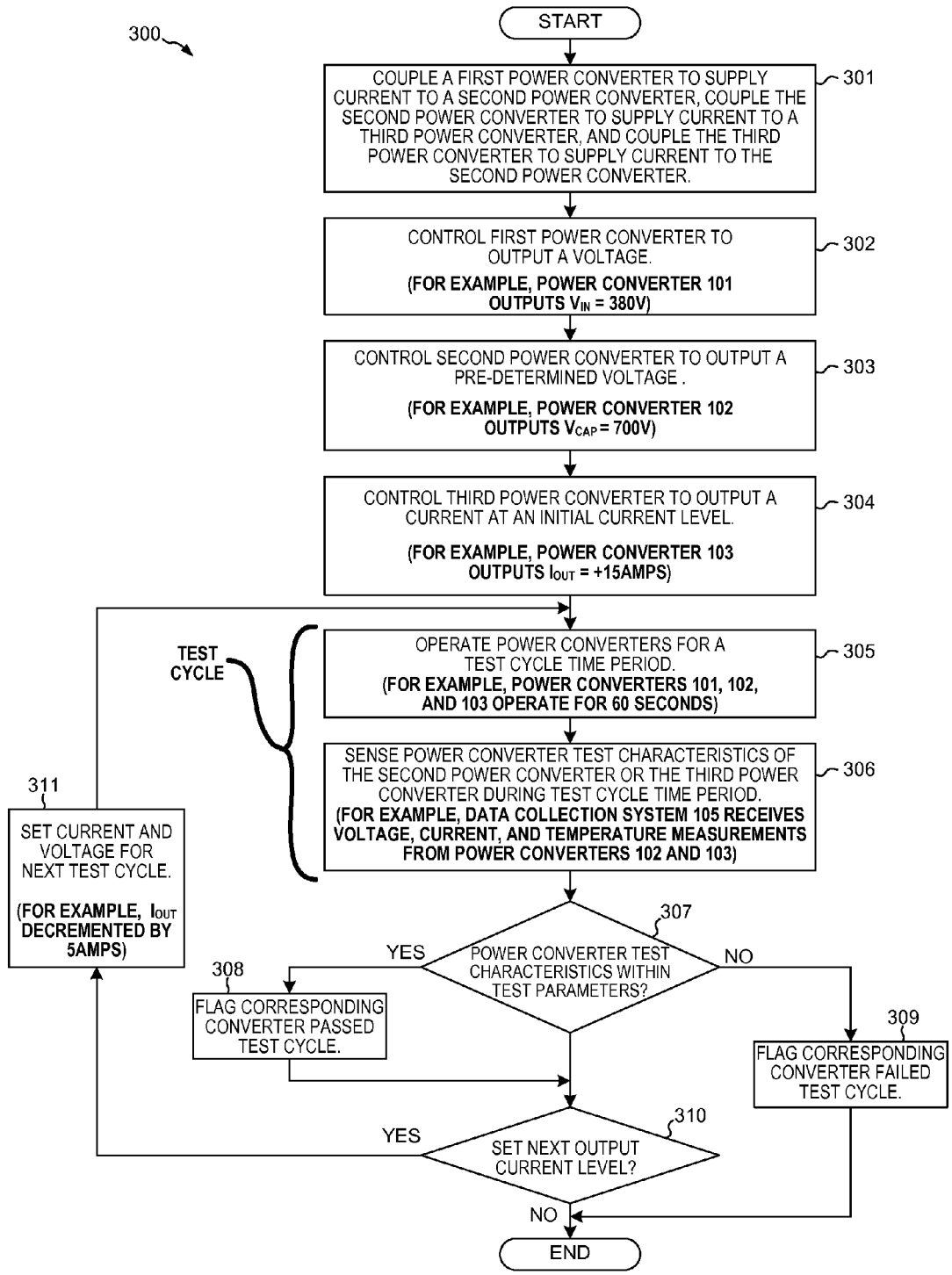
FIG. 8 is a flowchart of a method 300 of how test system 100 performs load testing on the second and third power converters 102 and 103, in accordance with one novel aspect.

FIG. 8 is a flowchart of a method 300 of how test system 100 performs load testing on the second and third power converters 102 and 103, in accordance with one novel aspect. In a first step (step 301), a first power converter is coupled to supply a current and a regulated voltage onto a second power converter. The second power converter is coupled to supply a current and a voltage to a third power converter. The third power converter is coupled to supply a regulated current and a voltage onto the second power converter. For example, in FIG. 5, the first power converter 101 and the third power converter 103 are coupled to the second power converter 102 via conductors 164 and 165.

The second power converter 102 is coupled to the third power converter 103 via conductors 169 and 170.

In a second step (step 302), the first power converter is controlled to output a regulated voltage. For example, in FIG. 5, the first power converter 101 is controlled to output a 380V regulated voltage $V_{IN}$ 163 onto conductors 164 and 165 via terminals 121 and 122. The 380V regulated voltage $V_{IN}$ 163 is present between the first and second terminals 131 and 132 of the second power converter 102. In the example of FIG. 5, the first power converter 101 is a dedicated switching power supply with a mechanism that allows the user to configure the regulated output voltage. In another example, the power converter 101 is controlled by the data collection system 105.

In a third step (step 303), the second power converter is controlled to output a pre-determined voltage. The pre-determined voltage is selected according to the typical voltage at which the second power converter is to operate in the field. Because this pre-determined voltage is the most common voltage at which the power converter is to operate, the pre-determined voltage is also referred to as an operating voltage. By operating the second power converter to output at the operating voltage, the load testing will yield test data relevant to expected actual field conditions the power converter will undergo. For example, in FIG. 5, the data collection system 105 communicates a digital control signal 174 to the second power converter 102 that causes the second power converter 102 to output a voltage $V_{CAP}$ 167 at 700V onto conductors 169 and 170. The voltage $V_{CAP}$ 167 is set to 700V because it is anticipated that the second power converter 102 will typically be controlled to output 700V in field applications, such as in an electric vehicle.

In a fourth step (step 304), the third power converter is controlled to output a regulated current at an initial current level. The regulated current is supplied to the second power converter. For example, in FIG. 5, the data collection system 105 communicates a digital control signal 176 to the third power converter 103 that causes the third power converter 103 to output and supply a current $I_{FB}$ 171 having an initial current level at approximately 27.6 amps onto the second power converter 102. This is achieved by power converter 103 controlling $I_{OUT}$ 168 to be +15 amps. The current $I_{FB}$ 171 flows along a current path extending from the third terminal 143 of the third power converter 103, through the first terminal 141 of the third power converter 103, through the third power converter 103, through the third terminal 143, through the supply node 172, and onto the first terminal 131. The current path does not extend through any discrete device having circuitry distinct from the second power converter 102, such as a resistive load, as in FIG. 1 (prior art), or a regenerative load, as in FIG. 2 (prior art).

In a fifth step (step 305), the first power converter, the second power converter, and the third power converter are operated at the set test configuration for a test cycle time period. For example, in FIG. 5, the first power converter 101 outputs a regulated 380V and the third power converter 103 outputs approximately 27.6 amps of current for a sixty second period of time.

In a sixth step (step 306), a power converter test characteristics is sensed for the second power converter or for the third power converter during the test cycle time period. The power converter test characteristic is a voltage present between two terminals of a power converter, a voltage internal to a power converter, a current flowing through a terminal of a power converter, a current internal to a power converter, a temperature at a surface of a power converter, and a temperature internal to a power converter. For example, in the example of FIG. 6, the second power converter 136 includes current sense circuitry 192 and 193 and voltage sense circuitry 194 and 195 that are used to obtain power converter test characteristics for the power converter 102. The obtained power converter test characteristics are communicated to the data collection system 105 via digital signal 178 during the sixty second test cycle time period. The third power converter 146 includes current sense circuitry 212 and 213 and voltage sense circuitry 214 and 215 used to obtain power converter test characteristics for the power converter 103 that is communicated to the data collection system 105 via digital signal 179. The processor 151 of the data collection system 105 stores the received power converter test characteristics identified by reference numeral 156.

In a seventh step (step 307), the power converter test characteristic is compared to power converter test parameters to determine whether the power converter passes or fails the test. If the power converter test characteristic is within the acceptable bounds of the power converter test parameter, then the power converter is flagged as having passed the test (step 308) and the power converter undergoes the next test cycle (step 310) and the next test cycle is configured (step 311). If, on the other hand, the power converter test characteristic is outside of the acceptable bounds of the power converter test parameter, then the power converter is flagged as having failed the test (step 309) and the load testing ends. For example, in FIG. 7, the processor 151 obtains the power converter test characteristic sensed during the test cycle time period and the power converter test parameters 217 stored in storage 152. The voltage parameter 217 has a lower limit 218 and an upper limit 219. The processor 151 compares the voltage sensed by the power converters 102 to the lower limit 218 and upper limit 219. If the sensed voltage is above the lower limit 218 and below the upper limit 219 during the test cycle, then the power converter 102 is flagged as having passed the test cycle and the power converter 102 undergoes the next test cycle. If, however, the sensed voltage is below the lower limit 218 or above the upper limit 219 during the test cycle, then the power converter 102 is flagged as having failed the test cycle and the load testing of power converter 102 is ended.

Figure 9:
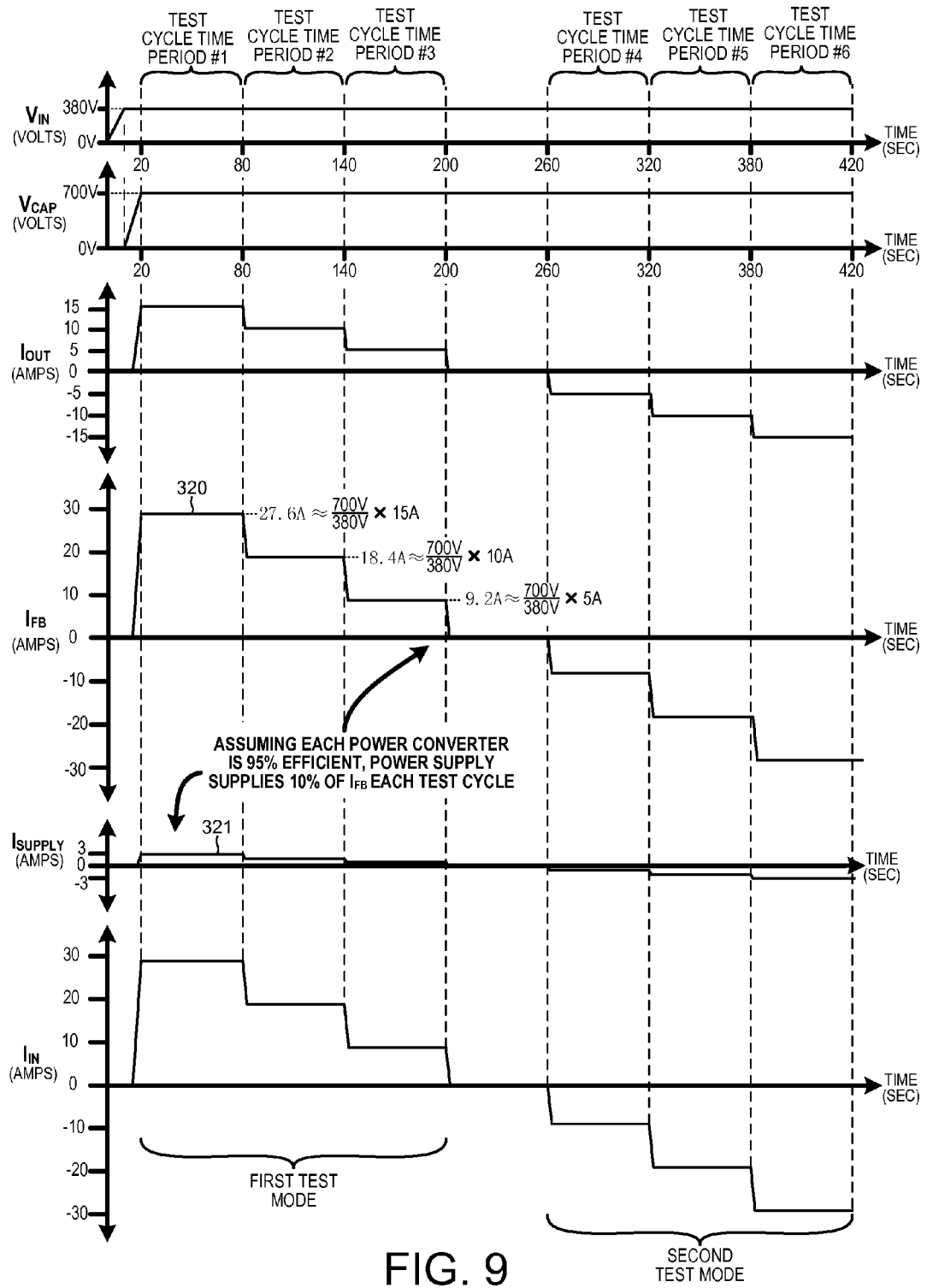
FIG. 9 is a waveform diagram of voltages and currents at various nodes throughout the test system during the load testing of the second power converter 102 and the third power converter 103.
Figure 10:
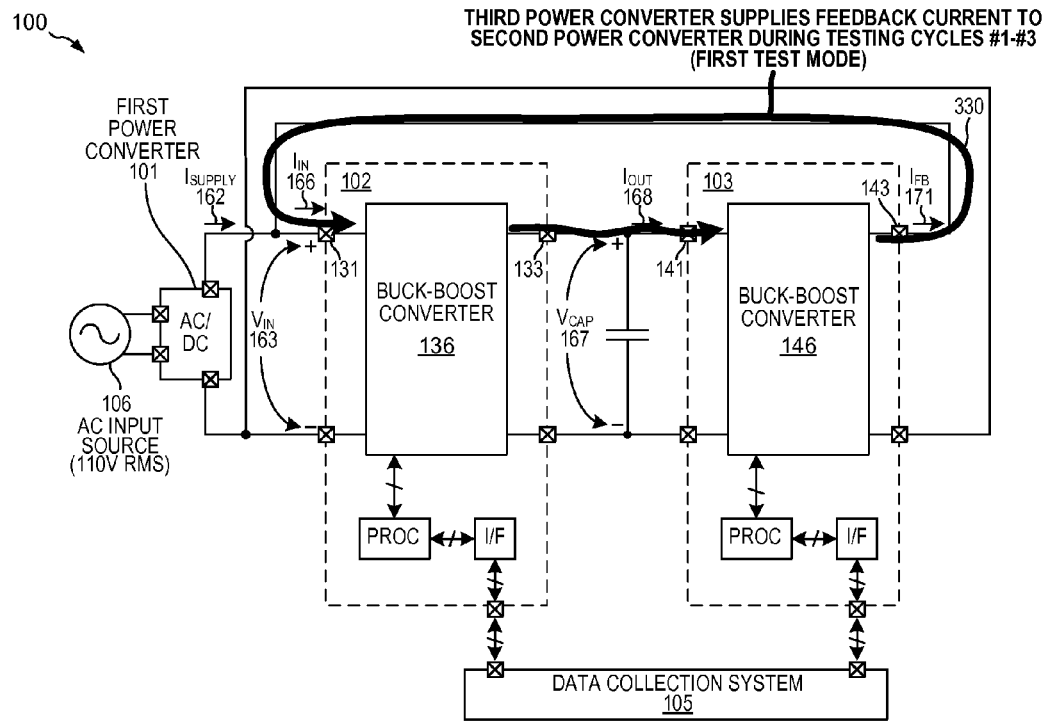
FIG. 10 is a block diagram showing a current path 330 when the second and third power converters 102 and 103 are operating in the first test mode.
Figure 11:
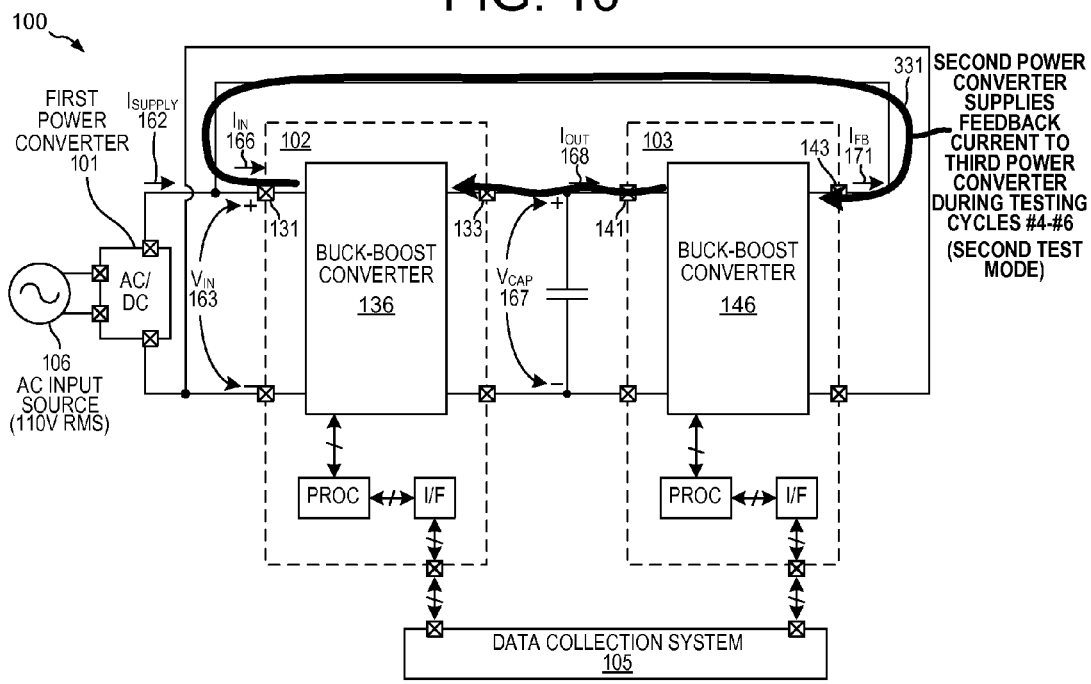
FIG. 11 is a block diagram showing a current path 331 when the second and third power converters 102 and 103 are operating in the second test mode.

FIG. 9 is a waveform diagram of voltages and currents at various nodes throughout the test system during the load testing of the second power converter 102 and the third power converter 103. Test cycle time periods #1-#3 identify a portion of the load testing when the second and third power converters 102 and 103 are controlled in a first testing mode. In the first testing mode, waveform 320 is at a positive current level indicating that current flows from the third power converter 103 to the second power converter 102 as shown in FIG. 10. Test cycle time periods #4-#6 identify a portion of the load testing when the second and third power converters 102 and 103 are controlled in a second testing mode. In the second testing mode, waveform 320 is at a negative current level indicating that current flows from the second power converter 102 to the third power converter 103 as shown in FIG. 11. Because the feedback current $I_{FB}$ 171 (waveform 320) is supplied from the third power converter 103 to the second power converter 102 (in the first test mode) or from the second power converter 102 to the third power converter 103 (in the second test mode), the only energy dissipated during load testing is due to inefficiencies inherent in the power converters 102 and 103. The energy dissipated is compensated by the first power converter 101 that supplies current $I_{SUPPLY}$ 162 (waveform 321) onto the supply node 172. Assuming each of the power converters 102 and 103 is ninety-five percent efficient, each power converter will cause five percent of the energy received to be dissipated as heat during each test cycle. As such, the first power converter 101 generates and outputs $I_{SUPPLY}$ 162 that is approximately ten percent of the total current that flows through the second and third power converters 102 and 103 during a test cycle. The minimal power dissipated in each test cycle results in significant advantages over the conventional load testing technique of FIG. 1 (Prior Art) where each test cycle results in power being dissipated through a resistive load.

FIG. 10 is a block diagram showing a current path 330 when the second and third power converters 102 and 103 and are operating in the first test mode. In the first test mode, a current path 330 extends from the second power converter 102, through the terminal 133, through the terminal 141, through the third power converter 103, through the terminal 143 and onto the terminal 131 of the second power converter 102. No external load or regenerative load is present along the current path 330. No discrete circuit element that is distinct from the second power converter 102 is present along the current path 330 because power converter 103 is an equivalent circuit structure as power converter 102.

FIG. 11 is a block diagram showing a current path 331 when the second and third power converters 102 and 103 are operating in the second test mode. In the second test mode, a current path 331 extends from the third power converter 103, through the terminal 141, through the terminal 133, through the second power converter 102, through the terminal 131 and onto the terminal 143 of the third power converter 103. No external load or regenerative load is present along the current path 331. No discrete circuit element that is distinct from the third power converter 103 is present along the current path 331 because power converter 102 is an equivalent circuit structure as power converter 103.

FIG. 12 is a diagram of the test system 100 showing how all power losses resulting from supplying current to the converters 102 and 103 are dissipated entirely by the converters 102 and 103. No resistive load or external element consumes power in the test system 100.

Figure 2:
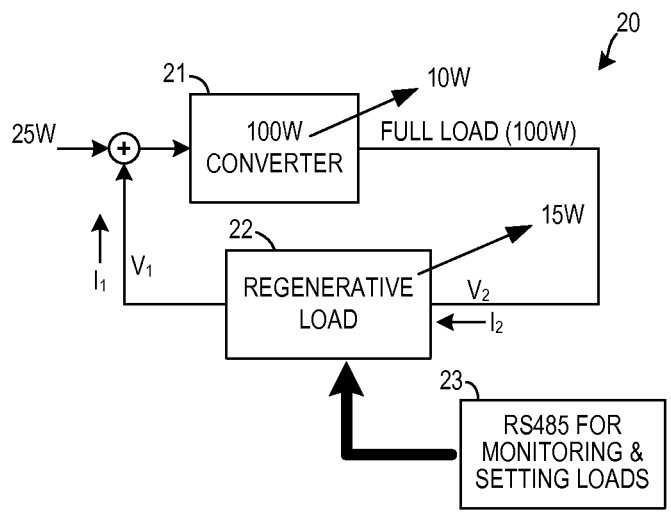
FIG. 2 (Prior Art) is a diagram of a conventional test system 20 that has improved power consumption over system 10.

FIG. 13 is a table 340 identifying several advantages between the novel test system 100 of FIG. 5 and the conventional test systems of FIGS. 1 and 2.

Figure 14:
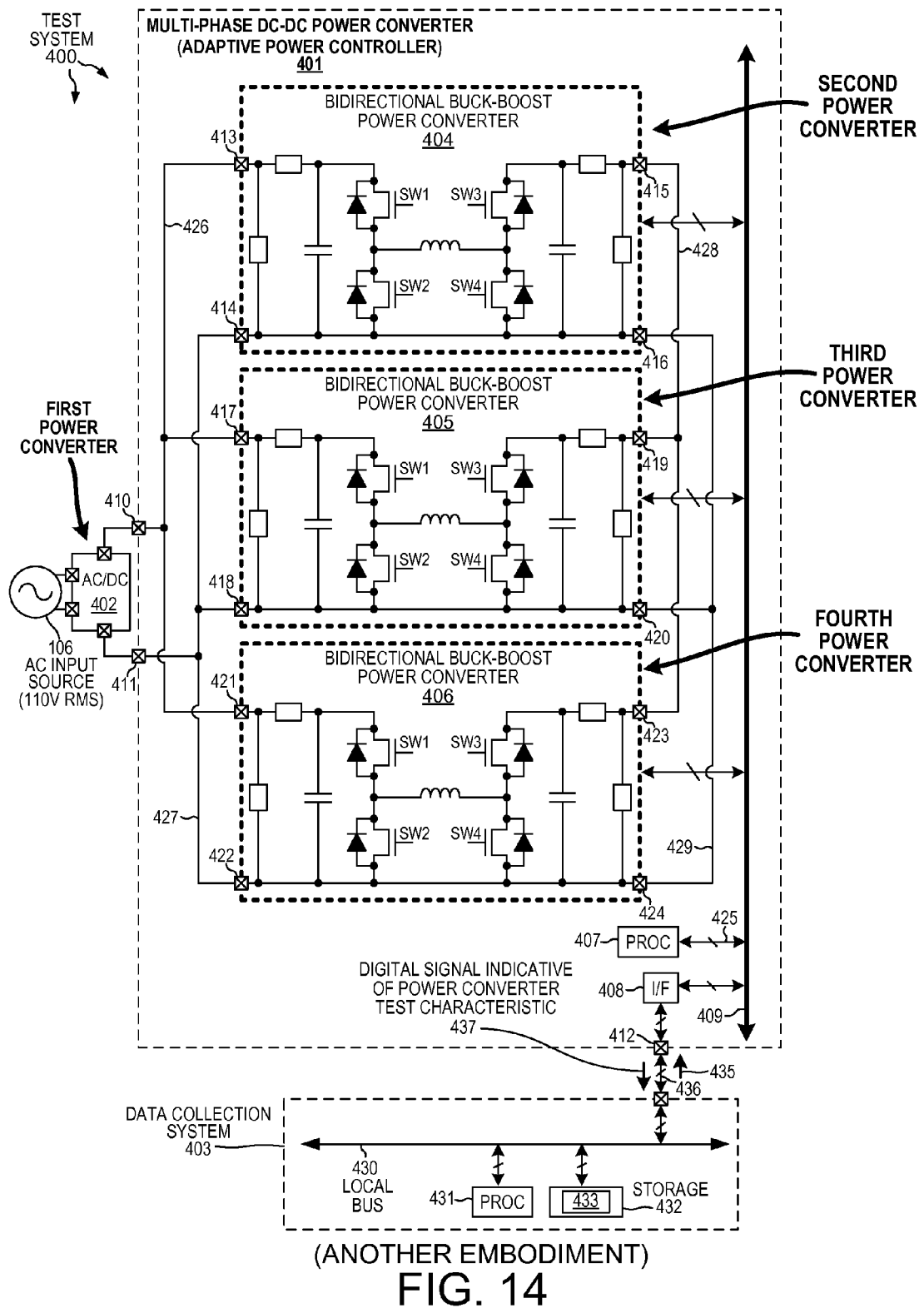
FIG. 14 is a circuit diagram of a test system 400 in accordance with another embodiment.

FIG. 14 is a circuit diagram of a test system 400 in accordance with another embodiment. Test system 400 includes a multi-phase DC-to-DC power converter 401, a first power converter 402, and a data collection system 403. Test system 400 operates in a similar fashion as the test system 100 of FIG. 6, except that the power converters to be load tested are part of the multi-phase DC-to-DC power converter 401. The multi-phase DC-to-DC power converter 401 comprises a second power converter 404, a third power converter 405, a fourth power converter 406, a processor 407, a interface circuit 408, a local bus 409, a first terminal 410, a second terminal 411, and a third terminal 412. The processor 407 controls operation of power converters 404-406 and obtains power converter test characteristics from the power converters 404-406 through local bus 409 via conductors 425. The data collection system 403 includes a local bus 430, a processor 431, and storage 432. The storage 432 stores test data 433 obtained during load testing of the power converters 404-406. The data collection system 403 communicates a digital control signal 435 via a USB/CAN link 436, and the data collection system 403 receives a digital signal 437 indicative of a power converter test characteristic also via the USB/CAN link 436.

Each of the power converters 404-406 is of a substantially identical circuit structure as the converters 136 and 146 of FIG. 6. The second power converter 404 includes a first terminal 413, a second terminal 414, a third terminal 415, and a fourth terminal 416. The third power converter 405 includes a first terminal 417, a second terminal 418, a third terminal 419, and a fourth terminal 420. The third power converter 406 includes a first terminal 421, a second terminal 422, a third terminal 423, and a fourth terminal 424. Terminals 413, 417, and 421 are coupled to terminal 410 via conductor 426. Terminals 414, 418, and 422 are coupled to terminal 411 by conductor 427. Terminals 415, 419, and 423 are coupled together via conductor 428. Terminals 416, 420, and 424 are coupled together via conductor 429. Each of the converters 404-406 is also referred to as a "sub-converter" because it is part of the multi-phase DC-to-DC power converter 401. The multi-phase DC-to-DC power converter 401 is also referred to as an "adaptive power controller".

The test system 400 performs load testing on one of the power converters 404-406 using another one of the two power converters 404-406 to supply a feedback current onto the power converter that is under test. In operation, if data collection system 403 is to test the second power converter 404, the processor 431 executes test instructions causing a digital control signal 435 to be communicated to the multi-phase DC-to-DC power converter 401 via USB/CAN link 436. The processor 407 processes the digital control signal 435 and controls the second power converter 404 to receive a current from first power converter 402 onto terminal 413 via conductor 426 during a test cycle time period. The first power converter 402 outputs a regulated voltage. The second power converter 404 outputs a current onto terminal 419 of the third power converter 405 via conductor 428, and the third power converter 405 generates and supplies a feedback current onto terminal 413 of the second power converter 404 via conductor 426. The feedback current is supplied during the test cycle time period resulting in minimal power dissipation as in the test system 100 of FIG. 6. The processor 407 obtains sensed power converter test characteristics from the second power converter 404 and causes a digital signal 437 indicative of the power converter test characteristic that is sensed to be communicated to the data collection system 403 via link 436. The processor 431 stores the sensed power converter test characteristic and processes the sensed power converter test characteristic to determine whether the second power converter 404 passes or fails the load testing cycle. The third and fourth power converters 405 and 406 are load tested in a similar fashion.

Figure 15:
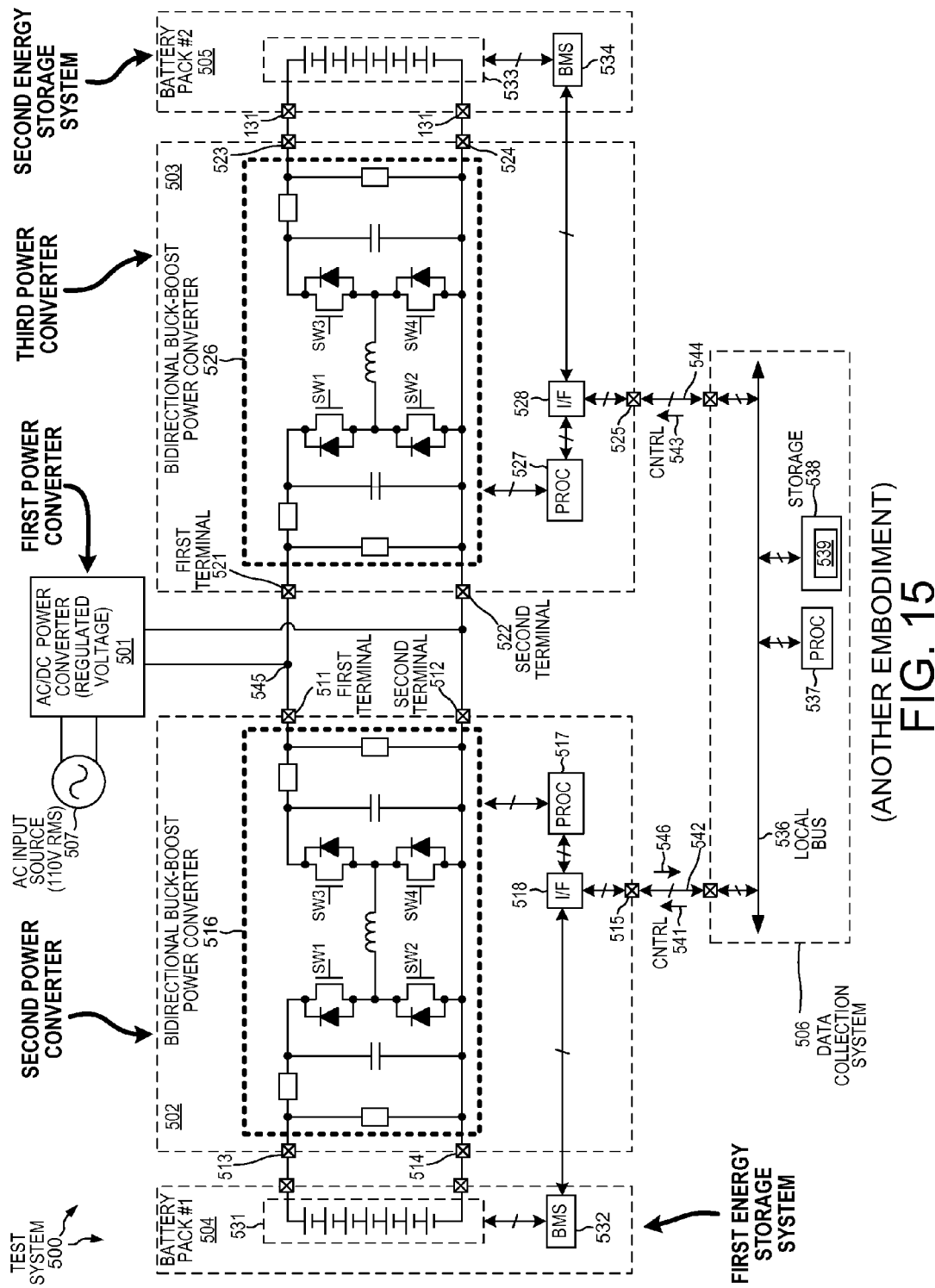
FIG. 15 is a circuit diagram of a test system 500 in accordance with yet another embodiment.

FIG. 15 is a circuit diagram of a test system 500 in accordance with yet another embodiment. Test system 500 operates in a similar fashion as the test system 100 of FIG. 6, except that each power converter is coupled to an energy storage system that is charged and discharged during test cycles. The test system 500 comprises a first power converter 501, a second power converter 502, a third power converter 503, a first energy storage system 504, a second energy storage system 505, and a data collection system 506. The first power converter operates as the first power converter 101 of FIG. 6, and receives a 110V RMS voltage from AC input source 507 and outputs a regulated voltage. The second power converter 502 comprises a first terminal 511, a second terminal 512, a third terminal 513, a fourth terminal 514, a fifth terminal 515, a DC-to-DC converter 516, a processor 517, and an interface circuit 518. The third power converter 503 comprises a first terminal 521, a second terminal 522, a third terminal 523, a fourth terminal 524, a fifth terminal 525, a DC-to-DC converter 526, a processor 527, and an interface circuit 528. In this example, each of the energy storage systems 504 and 505 is a battery pack. The first battery pack 504 comprises a plurality of cells 531 and a Battery Management System (BMS) 532. The second battery pack 505 comprises a plurality of cells 533 and a BMS 534. The data collection system 506 includes a local bus 536, a processor 537, and storage 538. The storage 538 stores test data 539 obtained during load testing of the power converters 502 and 503.

The second power converter 502 is configured to draw energy from the first battery pack 504 by processor 517 communicating with BMS 532 via interface circuit 518. Similarly, the third power converter 503 is configured to draw energy from the second battery pack 505 by processor 527 communicating with BMS 534 via interface circuit 528. For additional information on the structure, control and operation of the power converters 502 and 503 and the battery packs 504 and 505, see: 1) U.S. Patent Publication No. 2011/0089760, entitled "System And Method For Managing A Power System With Multiple Power Components", filed Oct. 20, 2010, by Castelaz et al., and 2) U.S. Patent Publication No. 2010/0237830, entitled "System and Method for Balancing Charge Within a Battery Pack", filed Mar. 23, 2010, by Castelaz et al. (the subject matter of each of these patent documents is incorporated herein in its entirety).

In addition, the data collection system 506 obtains energy storage test characteristics from the first and second battery packs 504 and 505 during the test cycle time period. The BMS 532 monitors energy storage test characteristics of the first battery pack 504, and the BMS 534 monitors energy storage test characteristics of the second battery pack 505. The energy storage test characteristics include State of Charge (SoC), State of Health (SoH), temperature, and other information monitored by the BMS. For additional information on types of energy storage test characteristics monitored by the BMS, how they are monitored, and how the BMS communicates the energy storage test characteristics, see: U.S. patent application Ser. No. 13/868,075, entitled "Performing Active Interrogation Of Battery Packs In Situ To Obtain Precise SoC And SoH Estimates", filed Apr. 22, 2013 by Castelaz (the subject matter of this patent document is incorporated herein in its entirety).

Test system 500 performs load testing on the second power converter 502 and the third power converter 503 by using, in part, energy stored in the battery packs 504 and 505. In one example, processor 537 of the data collection system 506 executes test instructions causing a digital control signal 541 to be communicated to the second power converter 502 via USB/CAN link 542 and a digital control signal 543 to be communicated to the third power converter 503 via USB/CAN link 544. Processor 517 of the second power converter 502 processes digital control signal 541 and controls the second power converter 502 to undergo load testing for a test cycle time period as described above. The data collection system 506 receives a digital signal 546 indicative of a power converter test characteristic of the second power converter 502 during the test cycle time period. The power converter test characteristic is sensed using sensing circuitry internal to the power converter 502 and without any external sensing device.

The second power converter 502 receives a current from a supply node 545 during the test cycle time period. The supply node 545 is supplied by the first power converter 501 and by the third power converter 503. The processor 527 processes the digital control signal 543 and determines if energy is available in the second battery pack 505. If energy is available, then the processor 527 causes the third power converter 503 to supply current onto the supply node 545 by drawing energy stored in the battery pack 505. If energy is not available in the second battery pack 505, then the second power converter 502 draws current primarily from the first power converter 501. During the test cycle time period, the second power converter 502 charges the first battery pack 504. The energy stored in the battery pack 504 may be processed by converter 502 during the load testing. Load testing of the third power converter 503 is performed in a similar fashion by drawing current from node 545 that is supplied by the first power converter 501 and from the second power converter 502 that draws energy from the first battery pack 504.

Figure 16:
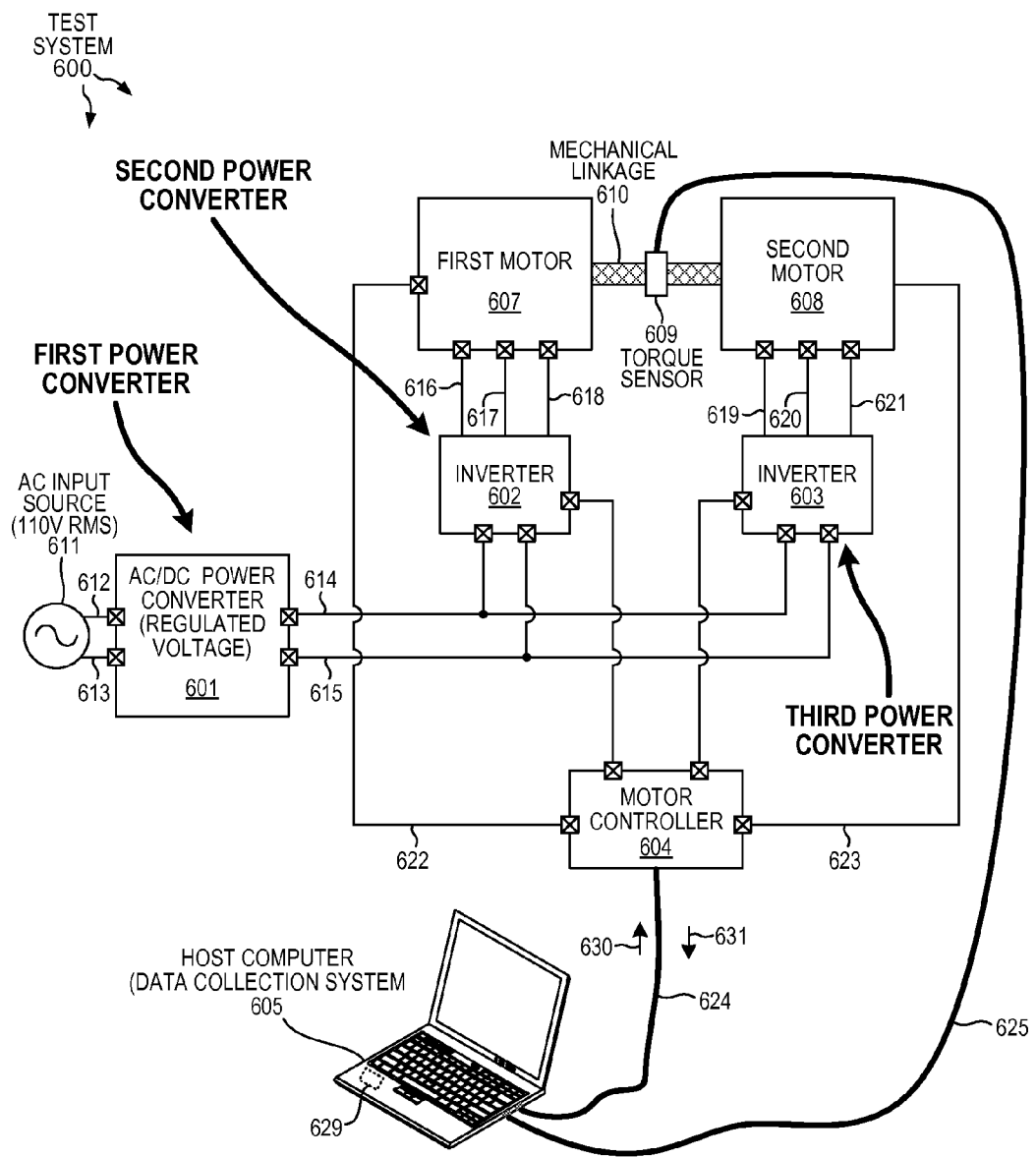
FIG. 16 is a block diagram of a test system 600 in accordance with yet another embodiment.

FIG. 16 is a block diagram of a test system 600 in accordance with yet another embodiment. Test system 600 includes a first power converter 601, a second power converter 602, a third power converter 603, a motor controller 604, a data collection system 605, three-phase motors 607 and 608, a torque sensor 609 and a mechanical link 610. In this example, the first power converter 601 is a AC-to-DC converter, and the second and third power converters 602 and 603 are inverters. The first power converter 601 receives a 110V RMS voltage from an AC input source 611 via conductors 612 and 613. The first power converter 601 outputs a current and a voltage, and supplies the second power converter 602 and the third power converter 603 via conductors 614 and 615. The second power converter 602 supplies the first motor 607 via conductors 616, 617 and 618. The third power converter 603 supplies the second motor 608 via conductors 619, 620, and 621. The motor controller 604 controls the first motor 607 via conductors 622 and the second motor 608 via conductors 623. The mechanical link 610 mechanically couples a motor output shaft of the first motor 607 and a motor output shaft of the second motor 608. The torque sensor 609 is configured to sense a torque on the mechanical link 610. Data collection system 605 communicates and controls the motor controller 604 via USB/CAN link 624 and the torque sensor 609 via USB/CAN link 625.

Test system 600 performs load testing on the first motor 607 and the second motor 608 by using, in part, energy generated by one of the motors 607 and 608. In one example, test system 600 is configured to perform load testing on the first motor 607. During the load testing, the first motor 607 drives mechanical linkage 610 thereby causing the second motor 608 to generate a feedback current. The feedback current is supplied from the third power converter 603 to the second power converter 602 and used, in part, to power the first motor 607 during a test cycle time period. Similarly, during load testing of the second motor 608, the second motor 608 drives mechanical linkage 610 thereby causing the first motor 607 to generate a feedback current. The feedback current is supplied from the second power converter 602 to the third power converter 603 and used, in part, to power the second motor 608 during a test cycle time period.

The data collection system 605 controls torque or angular velocity of the first and second motors 607 and 608. During testing, the data collection system 605 obtains test data from the motors 607 and 608 through motor controller 604 via sensing circuitry internal to motors 607 and 608. In addition, the data collection system 605 obtains test data from the motors 607 and 608 through motor controller 604 via external torque sensor 609. In another embodiment, the torque sensor 609 is internal to the first and second motors 607 and 608 and all sensing is done internally. The data collection system 605 analyzes the test data to determine whether the motors have a fault, for example, due to a manufacturing defect. In addition, the data collection system 605 is configured to detect input current on each of the first and second power converters 602 and 603 such that the data collection system 605 generates a torque and angular velocity dependent efficiency map for each motor that is tested.

Figure 17:
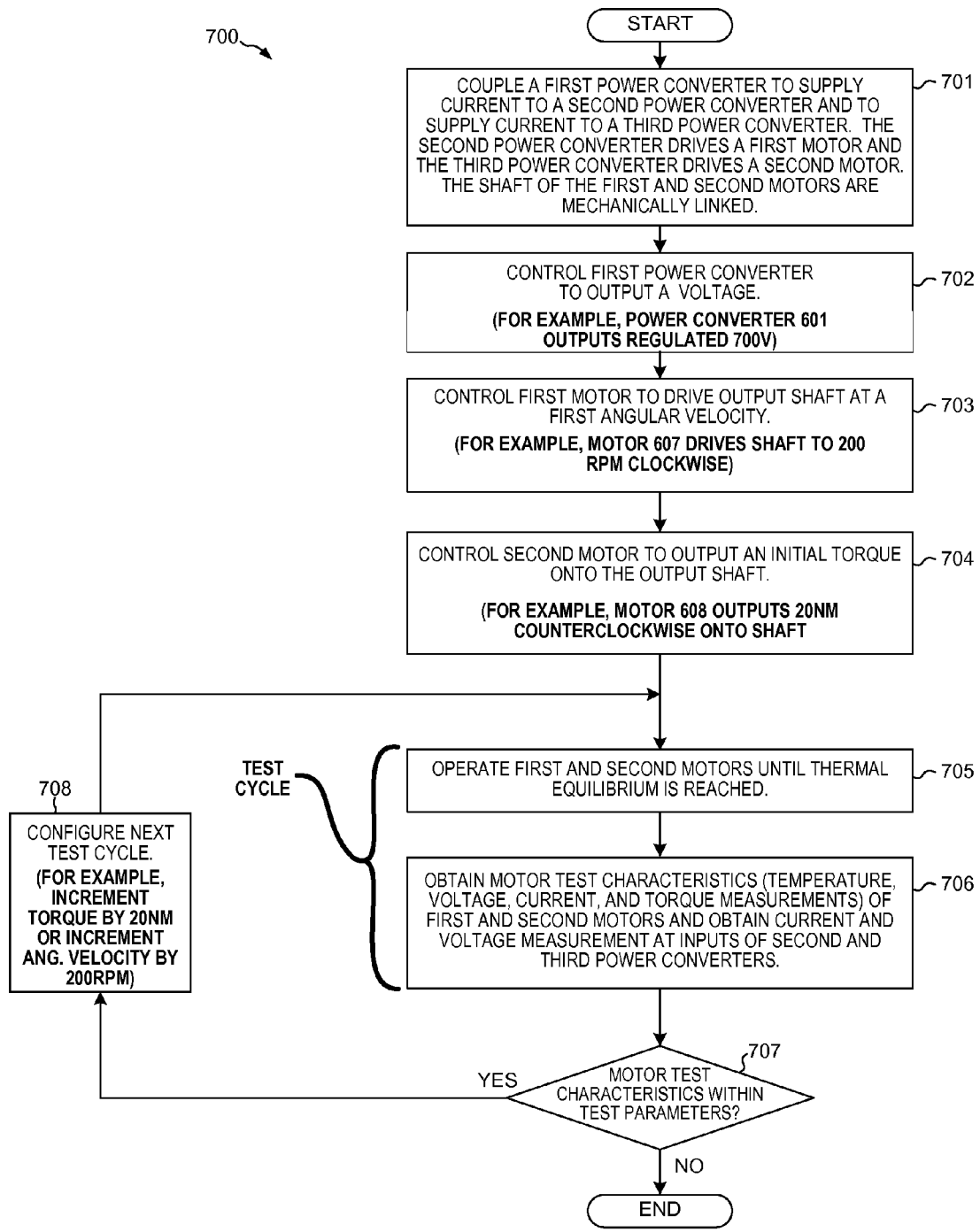
FIG. 17 is a flowchart of a method 700 in accordance with another novel aspect.

FIG. 17 is a flowchart of a method 700 in accordance with another novel aspect. In a first step (step 701) a first power converter is coupled to supply current to a second power converter and to a third power converter. The second power converter drives a first motor and the third power converter drives a second motor. A mechanical linkage couples an output shaft of the second motor to an output shaft of the third motor. For example, in FIG. 16, the inverters 602 and 603 are supplied by the AC-to-DC converter 601. The inverter 602 drives the first motor 607 and the inverter 603 drives the second motor 608. The mechanical linkage 610 is coupled to each output shaft of the motors 607 and 608.

In a second step (step 702), the first power converter is controlled to output a regulated voltage. In the example of FIG. 17, the AC-to-DC converter 601 outputs a regulated 700V onto the conductors 614 and 615.

In a third step (step 703), the first motor is controlled to drive an output shaft at a first angular velocity. For example, in FIG. 6, the data collection system 605 executes test instructions 629 that cause a digital signal 630 to be communicated to the motor controller 604 via USB/CAN link 624. The motor controller 604 processes the digital signal 630 and controls the motor 607 to drive the mechanical linkage 610 to 200 RPM in a clockwise rotation.

In a fourth step (step 704), the second motor is controlled to output an initial torque onto the output shaft. The torque is output in fashion that is counter to the rotation of the output of the shaft of the first motor 607. For example, in FIG. 16, the motor controller 604 controls the second motor 608 to output an initial torque of 20 Nm in a counterclockwise rotation. The output shaft of the second motor 608 is driven to counter the rotation of the first motor 607.

In a fifth step (step 705), the first and second motor are operated for a test cycle time period until thermal equilibrium is reached. For example, in FIG. 16, the motor controller 604 maintains the first motor 607 at the set output angular velocity (initially 200 RPM) and the second motor 608 at the set torque (initially 20 Nm).

In a sixth step (step 706), the data collection system obtains motor test characteristics, such as temperature, voltage, current, and torque during the test cycle time period. Each of temperature, voltage, current, and torque measurements is an example of a test characteristic that is obtained during the test cycle. The current and voltage at the input of the second and third power converters is also obtained. For example, in FIG. 16, the motor controller 604 communicates a digital signal 631 indicative of the sensed test characteristics to the data collection system 605 via the link 624. In addition, the data collection system 605 obtains a torque sensed by the torque sensor 609 via the link 625.

In a seventh step (step 707), the motor controller 604 determines whether the obtained motor test characteristics are within acceptable test parameters. If the obtained motor test characteristics are within the acceptable test parameters, then the test cycle is complete and a next test cycle is configured (step 708). If, on the other hand, the obtained motor test characteristics are outside the acceptable test parameters, then the testing is ended.

Although certain specific embodiments are described above for instructional purposes, the teachings of this patent document have general applicability and are not limited to the specific embodiments described above. For example, each of the power converters shown in the embodiments of FIGS. 6, 14, and 15, is a four terminal device. However, the second and fourth terminals of each power converter are electrically coupled, thus the same testing method shown in FIG. 8 may be employed with a three terminal power converter. Accordingly, various modifications, adaptations, and combinations of various features of the described embodiments can be practiced without departing from the scope of the invention as set forth in the claims.

What is claimed is:

1. A method comprising:
   (a) controlling a first power converter to output a current and a voltage, wherein the first power converter has a first terminal and a second terminal;
   (b) controlling a second power converter to output a current and a voltage, wherein the second power converter has a first terminal, a second terminal, and a third terminal, wherein the first terminal of the second power converter is coupled to the first terminal of the first power converter, and wherein the second terminal of the second power converter is coupled to the second terminal of the first power converter;
   (c) controlling a third power converter to output a current and a voltage, wherein the third power converter has a first terminal, a second terminal, and a third terminal, wherein the second power converter and the third power converter are of the same power converter type, wherein the first terminal of the third power converter is coupled to the third terminal of the second power converter, wherein the third terminal of the third power converter is coupled to the first terminal of the second power converter, and wherein the controlling of the first power converter, the second power converter, and the third power converter is performed for a test cycle time period; and
   (d) sensing at least one power converter test characteristic of the second power converter or at least one power converter test characteristic of the third power converter, wherein the at least one power converter test characteristic is sensed during the test cycle time period, and wherein energy is transferred between the second power converter and the third power converter during the test cycle time period.

2. The method of claim 1, wherein the power converter test characteristic is taken from the group consisting of: a voltage present between two terminals of a power converter, a voltage internal to a power converter, a current flowing through a terminal of a power converter, a current internal to a power converter, a temperature at a surface of a power converter, and a temperature internal to a power converter.

3. The method of claim 1, further comprising:
   (e) receiving a digital signal onto a terminal of a data collection system, wherein the digital signal is indicative of the sensed power converter test characteristic.

4. The method of claim 1, wherein no discrete device is present along a current path between the first terminal of the second power converter and the third terminal of the third power converter, wherein no discrete device is present between the third terminal of the second power converter and the first terminal of the third power converter, and wherein no discrete device is present along a current path between the first terminal of the second power converter and the first terminal of the first power converter.

5. The method of claim 1, wherein the first terminal of the first power converter is coupled to a supply node, wherein the first terminal of the second power converter is coupled to the supply node, wherein the third terminal of the third power converter is coupled to the supply node, wherein the second power converter and the third power converter are operable in a first mode and a second mode, wherein in the first mode, current flows from the third terminal of the third power converter, through the supply node, and onto the first terminal of the second power converter, and wherein in the second mode, current flows from the first terminal of the second power converter, through the supply node, and onto the third terminal of the third power converter.

6. The method of claim 1, wherein the second power converter is of a substantially identical structure as the third power converter.

7. The method of claim 1, wherein an Alternating Current (AC) source supplies power to the first power converter, and wherein the supplied power is not consumed by any element other than the first, second, and third power converters during the test cycle time period.

8. The method of claim 1, wherein the sensing of (d) is performed by sensing circuitry internal to the second power converter or by sensing circuitry internal to the third power converter.

9. The method of claim 1, wherein the second power converter and the third power converter are parts of a multi-phase Direct Current to Direct Current (DC-to-DC) power converter.

10. A method comprising:
(a) using a first power converter to perform load testing on a second power converter and a third power converter for a time period, wherein the first power converter outputs a current and a voltage onto the second power converter, wherein the second power converter outputs a current and a voltage onto the third power converter, wherein the third power converter outputs a current and a voltage onto the second power converter, wherein each of the second and third power converters is a bidirectional power converter, wherein energy is transferred between the second and third power converters during the load testing, and wherein no power processed by the first, second, and third power converters is consumed by any discrete element other than the first power converter, the second power converter and the third power converter during the time period.

11. The method of claim 10, wherein the second power converter is of a substantially identical structure as the third power converter.

12. The method of claim 10, wherein no discrete device is present along a current path between the second power converter and the third power converter, and wherein no discrete device is present along a current path between the second power converter and the first power converter.

13. The method of claim 10, wherein the load testing of the second power converter or the third power converter involves sensing at least one power converter test characteristic of the second power converter or at least one power converter test characteristic of the third power converter, and wherein the at least one power converter test characteristics is sensed during the time period.

14. The method of claim 13, wherein each of the at least one power converter test characteristics is taken from the group consisting of: a voltage present between two terminals of a power converter, a voltage internal to a power converter, a current flowing through a terminal of a power converter, a current internal to a power converter, a temperature at a surface of a power converter, and a temperature internal to a power converter.

15. A method comprising:
(a) controlling a first power converter to output a current and a voltage, wherein the first power converter has a first terminal and a second terminal;
(b) controlling a second power converter to output a current and a voltage, wherein the second power converter has a first terminal, a second terminal, a third terminal, and a fourth terminal, wherein the first terminal of the second power converter is coupled to the first terminal of the first power converter, wherein the second terminal of the second power converter is coupled to the second terminal of the first power converter, wherein the third terminal of the second power converter is coupled to a first terminal of a first energy storage system, and wherein the fourth terminal of the second power converter is coupled to a second terminal of the first energy storage system;
(c) controlling a third power converter to output a current and a voltage, wherein the third power converter has a first terminal, a second terminal, a third terminal, and a fourth terminal, wherein the second power converter is operationally equivalent to the third power converter, wherein the first terminal of the third power converter is coupled to the first terminal of the second power converter, wherein the second terminal of the third power converter is coupled to the second terminal of the second power converter, wherein the third terminal of the third power converter is coupled to a first terminal of a second energy storage system, wherein the fourth terminal of the third power converter is coupled to a second terminal of the second energy storage system, and wherein the controlling of the first power converter, the second power converter, and the third power converter is performed for a test cycle time period; and
(d) sensing at least one power converter test characteristic of the second power converter, at least one power converter test characteristic of the third power converter, or at least one energy storage test characteristic, wherein the sensed power converter test characteristic or energy storage test characteristic is sensed during the test cycle time period, and wherein one of the second and third power converters supplies the other of the second and third power converters during the test cycle time period.

16. The method of claim 15, wherein the power converter test characteristic is taken from the group consisting of: a voltage present between two terminals of a power converter, a voltage internal to a power converter, a current flowing through a terminal of a power converter, a current internal to a power converter, a temperature at a surface of a power converter, and a temperature internal to a power converter, and wherein the energy storage test characteristic is taken from the group consisting of: a State of Charge (Soc), a State of Health (SoH), and a temperature.

17. The method of claim 15, further comprising:
(e) receiving a digital signal onto a terminal of a data collection system, wherein the digital signal is indicative of the sensed power converter test characteristic or the sensed energy storage test characteristic.

18. The method of claim 15, wherein no discrete device is present along a current path between the first terminal of the second power converter and the first terminal of the third power converter, and wherein no discrete device is present along a current path between the second terminal of the second power converter and the second terminal of the third power converter.

19. The method of claim 15, wherein the second power converter is of a substantially identical structure as the third power converter.

20. The method of claim 15, wherein an Alternating Current (AC) source supplies power to the first power converter, and wherein the supplied power is not consumed by any element other than the first, second, and third power converters during the test cycle time period.

* * * * *